United States Patent
Richter et al.

(10) Patent No.: US 9,379,734 B2
(45) Date of Patent: Jun. 28, 2016

(54) METHOD AND ARRANGEMENT FOR SETTING AN EFFECTIVE RESOLUTION OF AN OUTPUT SIGNAL IN INCREMENTAL DELTA-SIGMA ANALOG-TO-DIGITAL CONVERTERS

(71) Applicant: ZENTRUM MIKROELEKTRONIK DRESDEN AG, Dresden (DE)

(72) Inventors: Raik Richter, Kreischa (DE); Marko Mailand, Dresden (DE)

(73) Assignee: ZENTRUM MIKROELEKTRONIK DRESEN AG, Dresden (DE)

( * ) Notice: Subject to any disclaimer, the term of this patent is extended or adjusted under 35 U.S.C. 154(b) by 0 days.

(21) Appl. No.: 14/939,679

(22) Filed: Nov. 12, 2015

(65) Prior Publication Data
US 2016/0142072 A1 May 19, 2016

(30) Foreign Application Priority Data
Nov. 13, 2014 (DE) .......................... 10 2014 116 599

(51) Int. Cl.
*H03M 3/00* (2006.01)
(52) U.S. Cl.
CPC .............. *H03M 3/464* (2013.01); *H03M 3/356* (2013.01)
(58) Field of Classification Search
CPC ....... H03M 3/356; H03M 3/464; H03M 3/30; H03M 3/452; H03M 3/322
USPC .......... 341/172, 143, 155, 144, 118, 120, 131
See application file for complete search history.

(56) References Cited

U.S. PATENT DOCUMENTS

| | | | | |
|---|---|---|---|---|
| 6,037,887 | A * | 3/2000 | Wu ....................... | H03M 3/486 341/139 |
| 6,909,388 | B1 | 6/2005 | Quiquempoix et al. | |
| 7,825,838 | B1 | 11/2010 | Srinivas et al. | |
| 2008/0024348 | A1* | 1/2008 | Liu ....................... | H03M 3/474 341/155 |
| 2008/0062022 | A1* | 3/2008 | Melanson ............. | H03M 3/464 341/143 |
| 2008/0074303 | A1 | 3/2008 | Rueger et al. | |
| 2008/0136666 | A1* | 6/2008 | Hammerschmidt ... | G08C 15/06 340/870.02 |
| 2011/0163901 | A1 | 7/2011 | Quiquempoix et al. | |
| 2013/0082766 | A1* | 4/2013 | Chen .................... | H03M 3/396 327/557 |

FOREIGN PATENT DOCUMENTS

DE 102011079211 B3 12/2012
GB 2 507 332 A 4/2014

* cited by examiner

*Primary Examiner* — Peguy Jean Pierre
(74) *Attorney, Agent, or Firm* — Heslin Rothenberg Farley & Mesiti P.C.

(57) ABSTRACT

A method and arrangement for setting an effective resolution of an output signal in an incremental delta-sigma analog-to-digital conversion by an incremental delta-sigma analog-to-digital converter, includes feeding a difference between an input signal and a reference voltage signal formed in a feedback branch to a first integrator. Safeguarding the stability of multi-stage incremental delta-sigma analog-to-digital converters for large input signal ranges and not requiring direct damping of the input signal, such that a direct SNR impairment with regard to the ADC-inherent noise sources can be avoided, is achieved by a virtual reference voltage in the feedback branch of the incremental delta-sigma analog-to-digital converter. The reference voltage signal is adapted to a changing input signal range by a settable reference capacitance and a clock cycle number dependent thereon is set.

12 Claims, 3 Drawing Sheets

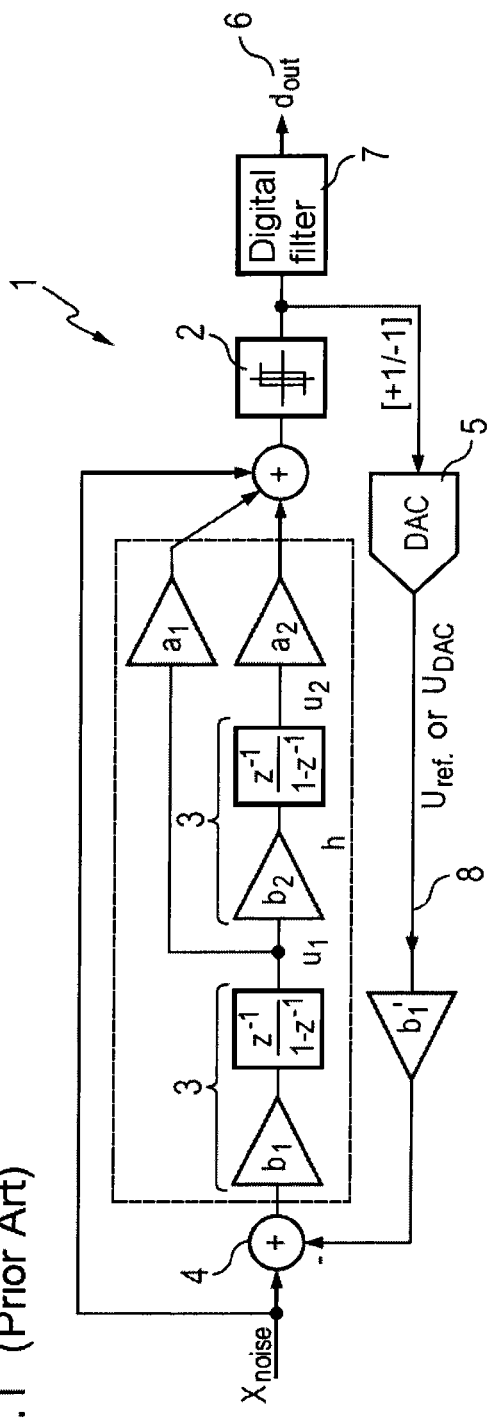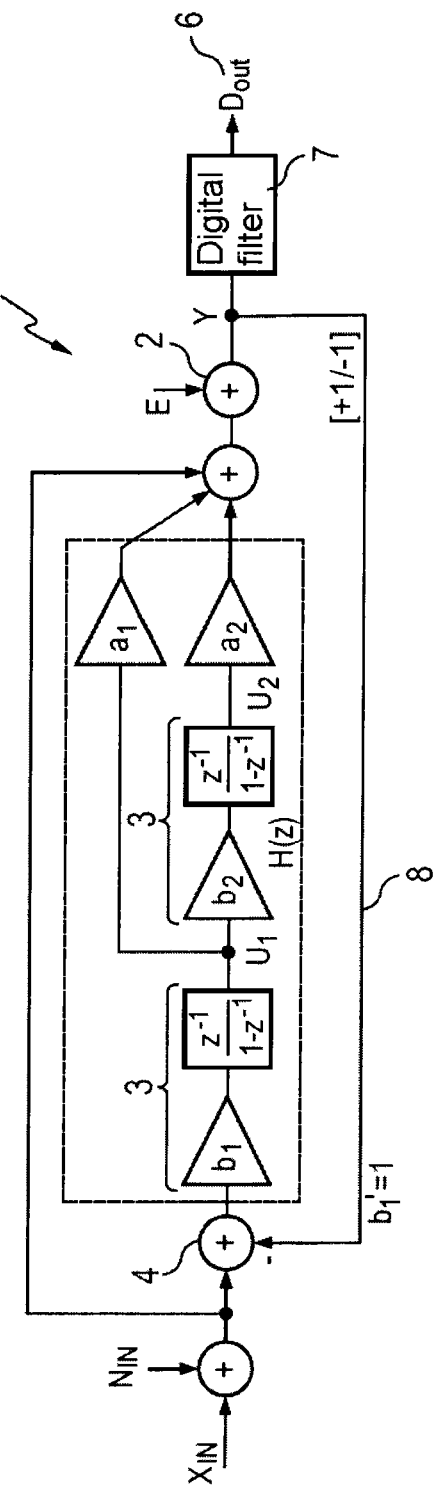
Fig. 1 (Prior Art)
Fig. 2 (Prior Art)

METHOD AND ARRANGEMENT FOR SETTING AN EFFECTIVE RESOLUTION OF AN OUTPUT SIGNAL IN INCREMENTAL DELTA-SIGMA ANALOG-TO-DIGITAL CONVERTERS

CROSS REFERENCE TO RELATED APPLICATION

This application claims priority of German application DE 10 2014 116 599.3 filed on Nov. 13, 2014, the entire contents of which is hereby incorporated by reference herein.

BACKGROUND ART

The invention relates to a method for setting an effective resolution of an output signal in an incremental delta-sigma analog-to-digital conversion by means of an incremental delta-sigma analog-to-digital converter, in which the difference between an input signal and a reference voltage signal formed in a feedback branch is fed to a first integrator.

The invention furthermore relates to an arrangement for incremental delta-sigma analog-to-digital conversion, wherein the incremental delta-sigma analog-to-digital converter comprises a difference forming unit for forming a difference between an analog modulator input signal and an analog reference voltage signal and for generating a difference voltage signal ($u'_{in}$), a resettable first integrator for integrating or summing the difference signal and generating a first integrator signal ($u_1$), a quantizer for receiving the integrator signal and generating a quantization signal, the bit stream, and a digital-to-analog converter in a feedback branch for receiving the digital quantization signal and outputting the reference voltage signal to the difference forming unit.

The prior art is constituted by incremental delta-sigma analog-to-digital converters (iDS-ADCs) of a wide variety of architectures in which an input signal to be converted is firstly modulated by a modulator loop for a certain, predefined clock cycle number N and the digital bit stream at the output of the internal quantizer is digitally filtered. The digital filter then outputs a digital representation of the analog input signal $U_{in}$ after N clock cycles.

The prior art discloses some methods and arrangements which are utilized for avoiding or eliminating problems that occur with the use of incremental delta-sigma analog-to-digital converters.

U.S. Pat. No. 6,909,388 B1 discloses for example a method which can be used to isolate and compensate for the input offset of a sampled input signal for an analog-to-digital (A/D) conversion using incremental delta-sigma analog-to-digital converters. Using a fractal algorithm, for this purpose a sampling sequence is utilized by means of which the offset can be compensated for via a suitable, switched capacitance. Thus, in U.S. Pat. No. 6,909,388 B1, a reduction of the flicker noise component in the output signal also becomes possible besides the real-time offset compensation and the corresponding increase in the effective output dynamic range of the iDS-ADC. In addition, the method presented in U.S. Pat. No. 6,909,388 B1 is independent of a multiplicity of technological process parameter variations, e.g. resulting in component mismatch.

US 2008/0074303 A1 discloses a method for improving the stability and for increasing the input voltage range in multi-stage, incremental delta-sigma analog-to-digital converters. In that case, at the beginning of each new AD conversion, either at least one or a plurality of integrator stages are held in the reset state and are switched in only after the first loop pass according to a specific scheme, or all the integrator stages are initially in the reset state and are switched in stage by stage per loop pass or iteration. The corresponding integrator stages remain stable here, as does the total transfer of the iDS-ADC. With the reset initialization method according to US 2008/0074303 A1, it thus becomes possible to realize noise transfer functions (for short: NTFs) which, for larger iDS-ADC input voltage signals, would have resulted in an unstable behaviour of the ADC under certain circumstances. Consequently, it is possible to realize more aggressive NTFs or to process higher input voltage signal ranges with an iDS-ADC. Furthermore, by means of the method set out in US 2008/0074303 A1, the realization of higher-order iDS-ADCs is simplified in particular with regard to fulfilling the necessary stability criteria (e.g. at high levels of the input signal). The specific use of an iDS-ADC is substantiated in US 2008/0074303 A1, inter alia, by the fact that the latency of iDS-ADCs corresponds to only approximately half of the baseband sample period of the connected decimation filter, as a result of which, firstly, individual conversions, such as e.g. by means of successive approximation register (SAR) converters, become possible. This is advantageous for the use of such an ADC in such applications in which the energy demand per conversion is of primary importance or/and in which the ADC is intended, can or must repeatedly attain a quiescent state. This last is the case in multiplexed systems, for example, in which one and the same ADC is intended to process signals of different input sources. This is not possible to the same extent with traditional delta-sigma analog-to-digital converters, for example, but rather requires an increased control and time and energy expenditure.

In iDS-ADCs a switched-capacitance (for short: SC) arrangement is often used to process the input signal to be digitized and the required reference voltage. In order to reduce so-called mismatch errors as a result of the capacitances used and at the same time to minimize the phases required for charge transfer in such a circuit (sampling and charge transfer), US 2011/0163901 A1 proposes a method in which, by means of a capacitance array through a suitable selection and rotating allocation of different input capacitances during an A/D conversion, ultimately the mismatch influence and the gain error can be reduced. The method proposed in US 2011/0163901 A1 relates in that case to iDS-ADCs which operate using a chopped reference signal. According to US 2011/0163901 A1, the ratio of signal to reference (S/R) must therefore be less than 1 in order to ensure the stability in higher-order iDS-ADCs. In this context, it is possible to utilize the method described in US 2011/0163901 A1 for reducing mismatch and gain errors as it were ultimately also to achieve, by means of the capacitance array mentioned above, a damping of the input signal and thus: S/R<1 with the aim of modulator stability in iDS-ADCs with a chopped reference signal.

One specific realization of this method is explained in V. Quiquempoix et al.: "A Low-Power 22-bit Incremental ADC", IEEE Journal of Solid-State Circuits, Vol. 41, No. 7, July 2006 wherein a $3^{rd}$ order delta-sigma converter is used. An S/R ratio of 2/3 is striven for in order to obtain a differential input charge $Q_{in}$ of the iDS-ADC on the input capacitance $C_{in}$ (depending on the input voltage $U_{in}$ and the output voltage of the digital-to-analog converter (DAC) generated in the feedback path of the iDS-ADC: $U_{DAC}$) wherein $Q_{in}=C_{in}(2/3 \cdot U_{in}-U_{DAC})$ holds true. Alongside the condition that S/R<1 must be the case in principle, V. Quiquempoix et al. also explain that the clock cycle number N for an A/D conversion in the iDS-ADC should be an integral multiple of the reference in order in turn not to generate any further gain errors in the iDS-ADC.

DE 102011079211 B3 describes a method and the realization thereof as an incremental delta-sigma analog-to-digital converter, in which the quantization error is determined by means of a specific minimum determination on the basis of the internally processed quantization noise dependent on the input signal in the iDS-ADC at the output of the (multi-stage) integrator stage chain. An improvement in the accuracy of the output signal or output value of the iDS-ADC is thus made possible in accordance with DE 102011079211 B3. Furthermore, DE 102011079211 B3 describes that in the context of the explained method for improving the accuracy of the ADC output value, a reset of the converter values can or should be realized before a new AD conversion. Furthermore DE 102011079211 B3 discloses that in the method a quantization noise signal is scaled by means of a propagation-time-dependent coefficient in order to perform an adaptation of the loop passes in the iDS-ADC with the correspondingly scaled signal. This adaptation of the loop passes is principally aimed at the highest possible accuracy of the ADC output value.

Incremental delta-sigma analog-to-digital converters typically process an analog input signal in order to assign a digital output signal that is as proportional as possible to said input signal or in order to realize a preferably unique mapping of the analog input signal onto a digital output word (FIG. 1).

Generally, the input signal is superimposed by broadband noise (thermal noise). There are a series of ADC-inherent noise sources, such as thermal noise of resistors or recombination noise of active components having a pn junction in the ADC circuit. In the case of delta-sigma-based converters, the output noise is often dominated by so-called quantization noise and the input noise is often dominated by flicker or 1/f noise. On account of noise shaping within a (both traditional and incremental) delta-sigma analog-to-digital converter, a large part of the quantization noise and of the thermal noise $N_{IN}$ of the input signal can be shifted towards higher frequencies by so-called noise shaping and can be filtered by means of a low-pass filter and removed from the signal to be digitized. However, signal components such as DC signal offsets or/and a large part of the flicker noise cannot be compensated for thereby. FIG. 2 shows an equivalent illustration of the incremental delta-sigma analog-to-digital converter from FIG. 1 as a time-discrete system, that is to say a system operating in a sampled manner. The input signal noise shall be $N_{IN}$ and the noise caused by the quantization shall be E.

An increase in the order of the modulator in the incremental delta-sigma analog-to-digital converter generally results in an increase in the accuracy of the ADC output value, wherein at the same time the implementation outlay rises and it becomes increasingly more difficult to ensure the stability of the modulator loop, or only small loop stability reserves can be realized. This in turn leads to a higher, undesired susceptibility of the modulator loops and thus of the ADC per se to disturbances. The increase in the modulator order likewise leads to a reduction of the input signal range processable in the incremental delta-sigma analog-to-digital converter, and thus to a reduction of the input dynamic range.

Incremental delta-sigma analog-to-digital converters differ from conventional delta-sigma ADCs in particular to the effect that the integrators are reset for each new A/D conversion and, consequently, there is a direct mapping of an input signal value onto exactly only one output signal value. This is advantageous, inter alia, for use in multiplexed systems having a plurality of input signal sources.

Every higher-order delta-sigma-modulator-based converter is restricted with regard to its stability to an input signal range (dynamic range) which corresponds to only part of the reference voltage used. Therefore, the input signal has to be damped, if appropriate, in order reliably to remain in the stable operating range of multi-stage iDS-ADCs. It is typical here that as the modulator order increases, the degree of damping with regard to the input signal also increases. However, this also results in an impairment of the input signal level available in the ADC, which in turn entails either a reduction in the accuracy of the digital output signal or an increase in the signal processing complexity in order to achieve the same output accuracy which could be obtained by such an ADC (without stability limitation). Furthermore, offsets in the input signal can lead to a further reduction in the dynamic range actually available for the useful signal component in the input signal. Such offsets should therefore be removed before the conversion in the iDS-ADC. For this purpose, either the method from the U.S. Pat. No. 6,909,388 B1 could be used, or an extended dynamic range with stable ADC behaviour should be provided.

BRIEF SUMMARY OF THE INVENTION

Therefore, it is an object of the present invention to present an arrangement and a method by means of which the stability of multi-stage incremental delta-sigma analog-to-digital converters for large input signal ranges can be safeguarded. Consequently, the conflicting coupling of input dynamic range and stability of the modulator loop is intended to be alleviated and largely eliminated.

A further object is, despite an improved processable input dynamic range, not requiring direct damping of the input signal, such that a direct SNR impairment with regard to the ADC-inherent noise sources can be avoided.

Furthermore, different effective resolutions and/or accuracies are intended to be settable and achievable with one and the same incremental delta-sigma analog-to-digital converter in order to be able to realize not only simply multiplexed systems but also systems and applications with only one ADC in which there are different requirements with regard to the accuracy and resolution of the output signal. This is desirable particularly with regard to minimizing the processing duration and thus the required energy, in order to ensure the best possible energy efficiency.

A further object of the present invention is to be able to process larger input signal ranges stably even in multi-stage incremental delta-sigma analog-to-digital converters, wherein a programmability of the resolution and/or accuracy of the incremental delta-sigma analog-to-digital converter is possible at the same time.

Furthermore, higher accuracies are intended to be made possible by an optimally adaptable clock number control in relation to an input dynamic range to be processed.

The object is achieved in terms of the method by virtue of the fact that a virtual reference voltage is formed in the feedback branch of the incremental delta-sigma analog-to-digital converter, wherein the reference voltage signal is adapted to a changing input signal range by means of a settable reference capacitance $C_{ref}$ and a clock cycle number N dependent thereon is set. That affords the advantage that no damping of the input signal of the incremental delta-sigma analog-to-digital converter need be carried out and hence no SNR loss (signal-to-noise ratio) is to be recorded.

In one embodiment of the method, the reference capacitance $C_{ref}$ is adapted and set by means of a controllable capacitance array. The capacitance array comprises variable individual capacitances interconnectable in series or/and parallel arrangements. As a result, an optimum adaptation and setting of the reference capacitance $C_{ref}$ can be effected in such a way that the required input dynamic range can be fully modulated and the accuracy requirements of the output signal can be fulfilled.

In a further configuration of the proposed method, the selection of the reference capacitance $C_{ref}$ and the setting of the clock cycle number N are carried out in such a way that the input signal in a range of the operating voltage of $+/-V_{DD}$ modulates the incremental delta-sigma analog-to-digital converter to the maximum possible extent in a manner free of overdriving. The advantage here is that as a result of the choice of $U_{ref}$ and/or $Q_{ref}$, that is to say of $C_{ref}$ and the clock number N, the incremental delta-sigma analog-to-digital converter always permits the full modulation of the input signal of the incremental delta-sigma analog-to-digital converter in the range of +/−VDD, without becoming unstable. That is to say that the incremental delta-sigma analog-to-digital converter can thus always operate stably.

In a further embodiment of the invention, the reference capacitance $C_{ref}$ and the clock cycle number N are set by means of a control unit. The control unit thus monitors and controls the optimum selection of the reference capacitance from the capacitance array and the setting of an optimum clock cycle number N depending on the accuracy requirements made of the output signal under the condition that the incremental delta-sigma analog-to-digital converter remains in a stable range.

In a further embodiment of the method, the control unit controls at least two integrator stages of the incremental delta-sigma analog-to-digital converter, a quantizer and a digital-to-analog converter in the feedback branch. Of course, an incremental delta-sigma analog-to-digital converter having a higher order than the second order can also be controlled, such that the optimum selection of the reference capacitance $C_{ref}$ and the optimum setting of the clock cycle number N are always made.

In one embodiment of the method according to the invention, the control unit determines and sets an algorithm dependent according to a required accuracy range of the incremental delta-sigma analog-to-digital converter, the set reference capacitance $C_{ref}$ or the further measurement values inherent to the incremental delta-sigma analog-to-digital converter, an optimum clock cycle number N. The algorithm is adapted to the required accuracy range of the incremental delta-sigma analog-to-digital converter, the set reference capacitance $C_{ref}$ or the further measurement values inherent to the incremental delta-sigma analog-to-digital converter.

In a further advantageous embodiment of the method, a single incremental delta-sigma analog-to-digital converter is used for multiplexed systems. By way of example, the increase of $U_{ref}$ and/or $Q_{ref}$ (by means of the $C_1/C_{ref}$ ratio) in association with the different number of processing clock cycles N allows a simple, low-complexity programmability of the accuracy and/or of the effective, noise-free resolution of the digital ADC output signal of one and the same incremental delta-sigma analog-to-digital converter, wherein a maximum dynamic range of the input signal, a stability of the incremental delta-sigma analog-to-digital converter and a smallest possible clock number N become achievable at the same time. This ultimately results in the lowest possible energy consumption. This applies not only to systems which comprise a plurality of signals (multiplexed systems), but also to systems which have to fulfil potentially different requirements, concerning the analog-to-digital conversion. The optimization of the energy efficiency or minimization of the energy demand per effective LSB for a predefined, desired accuracy of the incremental delta-sigma analog-to-digital converter constitutes a particular advantage of the present invention.

In a further embodiment of the method, the incremental delta-sigma analog-to-digital converter is adapted to the accuracy requirement of an output signal. In this case, the accuracy requirement relates to the effective resolution of the ADC output signal, wherein an effective resolution of more than 16 bits is achievable here. Resolutions having values in the range of only 10 bits to 15 bits were possible with previous ADCs. The selection of the reference capacitance $C_{ref}$ and the setting of the clock cycle number N in the modulator loop make it possible to set the accuracy of the ADC output signal directly by means of the virtual reference in conjunction with the greatest possible input dynamic range. A correspondingly adapted clock cycle number N makes it possible to programme or set an effective resolution for different applications with one and the same iDS-ADC.

The object is achieved in terms of the arrangement by virtue of the fact that a controllable capacitance array is arranged in the feedback branch, wherein the capacitance array, the at least one integrator, the quantizer and the digital-to-analog converter in the feedback branch are connected to a control unit in a controlling fashion.

In one embodiment of the arrangement for incremental delta-sigma analog-to-digital conversion, the incremental delta-sigma analog-to-digital converter comprises M integrator stages. The accuracy of the output signal of the incremental delta-sigma analog-to-digital converter can thus be increased. The advantage of the arrangement according to the invention is, however, that when the converter order is increased, damping of the input signal is no longer necessary, rather the full dynamic range can be utilized and the accuracy of the conversion thus increases.

In a further embodiment of the arrangement, therefore, an input signal in a range of the operating voltage of $+/-V_{DD}$ of the incremental delta-sigma analog-to-digital converter is fully modulatable independently of the number of integrator stages M.

In one particular configuration of the invention, the control unit comprises a clock control logic. An adaptability of one and the same hardware circuit of an incremental delta-sigma analog-to-digital converter by means of the corresponding clock control logic is thus possible, wherein a novel software-based scaleability and improved IP re-use also become possible.

Generally, the method according to the invention and the arrangement according to the invention afford the advantage that the delta-sigma conversion becomes independent of process fluctuations since the stability and the incremental delta-sigma analog-to-digital converter transfer response are not dependent on absolute circuit and capacitance values ($C_1$, $C_{ref}$), but rather only on the ratio thereof—the stability for a maximally processable dynamic range remains safeguarded even in the event of fluctuations of the production process.

A simple realizability of stably operating incremental delta-sigma analog-to-digital converters of very high order is thus possible.

BRIEF DESCRIPTION OF THE DRAWING FIGURES

The invention will be explained in greater detail below on the basis of exemplary embodiments. In the associated drawings, FIG. 1 shows a traditional topology of a $2^{nd}$ order incremental delta-sigma analog-to-digital converter, FIG. 2 shows a $2^{nd}$ order incremental delta-sigma analog-to-digital converter as a time-discrete system with noise-equivalent input and output noise sources;

DETAILED DESCRIPTION

Figure 3:
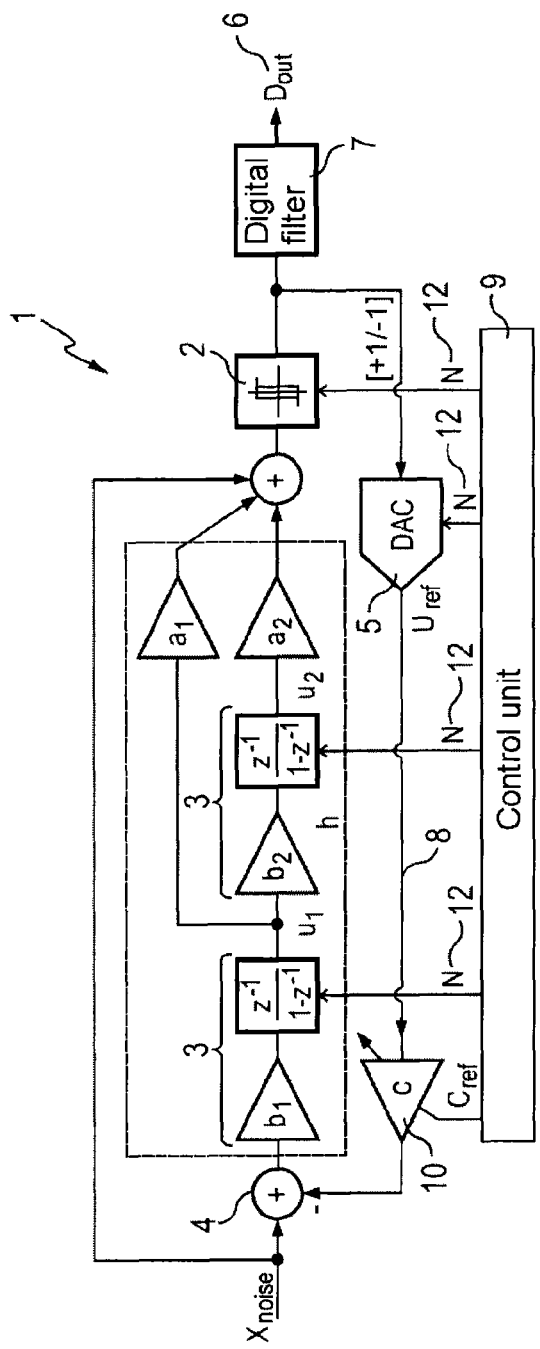
FIG. 3 shows an accuracy-programmable $2^{nd}$ order incremental delta-sigma analog-to-digital converter with virtual reference voltage generation.

FIG. 3 shows an accuracy-programmable $2^{nd}$ order incremental delta-sigma analog-to-digital converter with virtual reference voltage generation. Almost every analog-to-digital converter, thus including iDS-ADCs, requires a reference signal that is used to define a magnitude of an individual digitization step, $U_{LSB}$ or a least significant bit (LSB), or of the processable input signal range. Such ADCs are often realized as an electronic circuit in which the reference signal is a voltage $U_{ref}$ and the input signal is also a voltage $U_{in}$. The integrating behaviour of the modulator stages is generally achieved by means of charge storage and processing depending on $U_{in}$ and $U_{ref}$. For a typical iDS-ADC input stage, i.e. an integrating amplifier 3, the stored input charge $Q_{in}$ is proportional to the difference between input signal and feedback signal $U_{DAC}$, wherein $U_{DAC}$ is in turn dependent on $U_{ref}$ and $Q_{in}$ is likewise proportional to the input capacitance $C_1$. The following thus holds true: $Q_{in} \sim C_1 \cdot (U_{in} - U_{DAC})$. For a given operating voltage $V_{DD}$ of the incremental delta-sigma analog-to-digital converter 1, for the purpose of stability of the modulator loop it must be ensured that the internal partial voltages in the incremental delta-sigma analog-to-digital converter 1 remain small enough. In order not to bring about direct damping of the input signal $U_{in}$ with simultaneous loss of signal-to-noise ratio, $U_{DAC}$ or $U_{ref}$ is increased. This increase has the effect that the central signal term ($U_{in} - U_{DAC}$) remains small enough for stable operation of the delta-sigma modulator in the incremental delta-sigma analog-to-digital converter 1.

Figure 4:
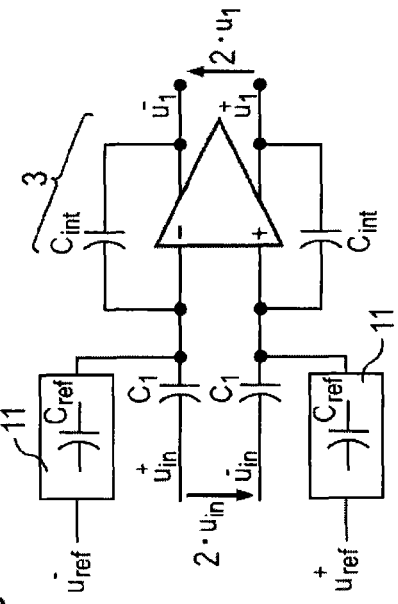
FIG. 4 shows a generalized iDS-ADC input stage, the figure showing a first integrator of the modulator chain for differential input signals with a capacitance array for generating the programmable, virtual reference voltage.

FIG. 4 shows the first integrator stage 3 of an incremental delta-sigma analog-to-digital converter 1. In this case, the input charge of the iDS-ADC has the following composition: $Q_{in} = C_1 \cdot U_{in} - C_{ref} \cdot U_{ref}$ wherein the differential voltages result as follows from the specified individual signals: $2*U_{in} = U^+_{in} - U^-_{in}$ and $2*U_{ref} = U^+_{ref} - U^+_{ref}$.

In this case, the input signal range of $U_{in}$ can be maximal with regard to the operating voltage $V_{DD}$, that is to say that $U_{in} \in [-V_{DD}, +V_{DD}]$. To maintain the stability of the modulator loop, the reference charge dependent on the reference voltage $U_{ref}$, $Q_{ref} = C_{ref} \cdot U_{ref}$ is increased by means of the capacitance $C_{ref}$. Therefore, in the incremental delta-sigma analog-to-digital converter 1, a virtual reference voltage signal takes effect which is not dependent on the absolute levels of the input and reference voltages, but rather is controlled directly in particular by means of the capacitance ratio $C_1/C_{ref}$. The digitization range and the usable input dynamic range are thus mapped onto the range $-Q_{ref}$ to $+Q_{ref}$. In this case, a larger $Q_{ref}$ is tantamount to a larger virtual reference voltage with the operating voltage $V_{DD}$ being assumed to be constant. That ultimately leads to an increase in the step size $U_{LSB}$ which is realized with a corresponding increase in the clock cycle number N, i.e. the loop passes for an A/D conversion in the iDS-ADC. The selection of $C_{ref}$ and the setting of the associated clock cycle number N are carried out by means of a suitable control unit (see FIG. 3 and FIG. 6).

Figure 5:
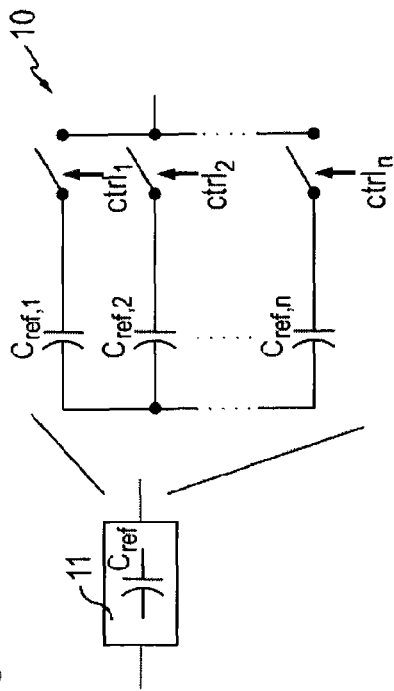
FIG. 5 shows a basic topology for the capacitance array for programming the virtual reference voltage.

FIG. 5 shows a simple capacitance array 10 at the first integrator stage 3. The selection of the $C_{ref}$ and the setting of the clock cycle number N in the modulator loop make it possible to set the accuracy of the ADC output signal directly by means of the virtual reference in conjunction with the largest possible input dynamic range. A correspondingly adapted clock cycle number N makes it possible to programme or set an effective resolution for different applications with one and the same iDS-ADC.

Figure 6:
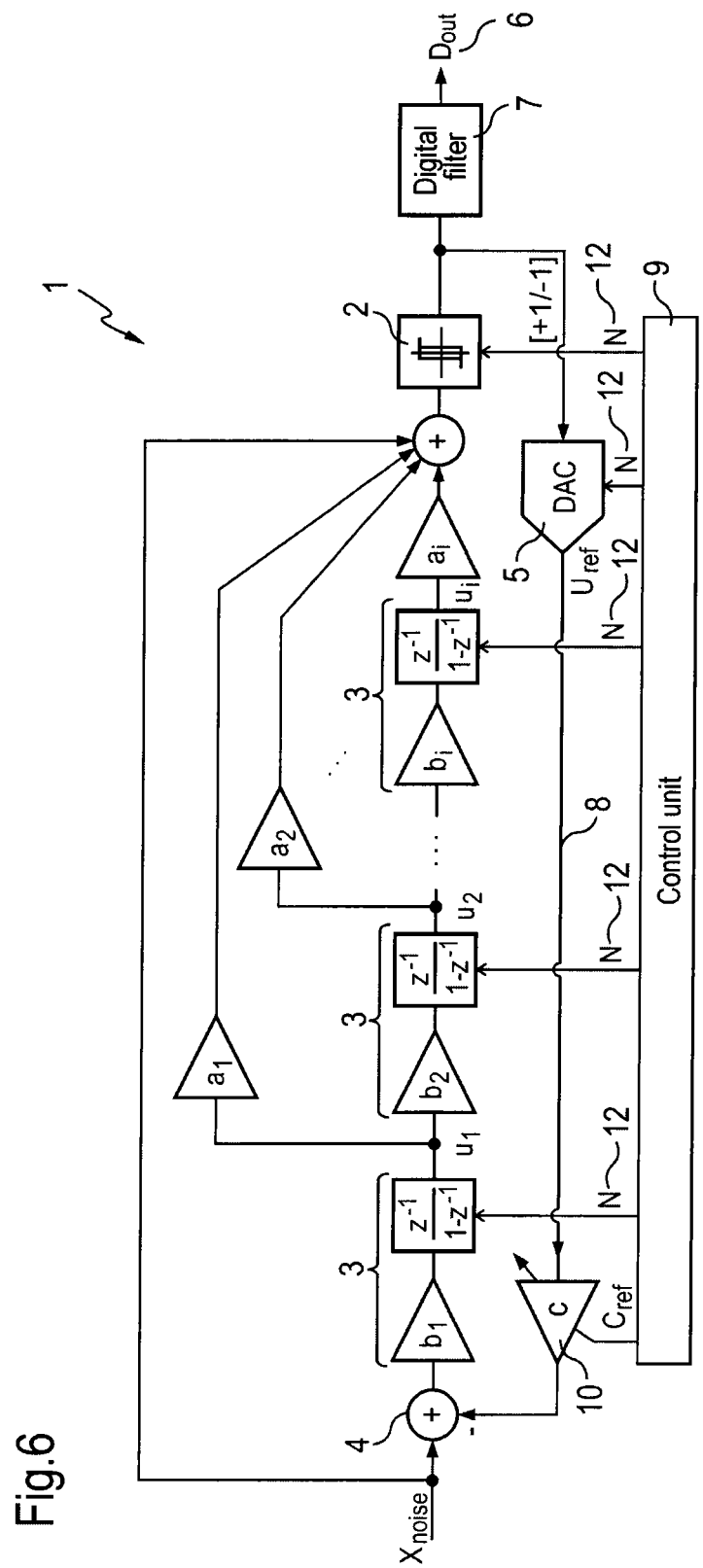
FIG. 6 shows a generalized, accuracy-programmable incremental delta-sigma analog-to-digital converter of arbitrary order i with virtual reference voltage generation.

FIG. 6 shows an incremental delta-sigma analog-to-digital converter 1 with order of arbitrary magnitude. For such complex applications, the clock cycle number N can be determined depending on the ratio $C_1/C_{ref}$ either in the context of the design process by means of a suitable algorithm, wherein the different, $C_{ref}$-dependent settable clock cycle numbers N are stored in a circuit, e.g. in a memory or as a hardwired circuit. Alternatively, the control unit 9 (also cf. FIG. 3) additionally implements a suitable algorithm which determines and sets an optimum and suitable clock cycle number N depending on the (externally) desired ADC accuracy, the set reference capacitance $C_{ref}$ 11 and, if appropriate, further, present iDS-ADC-inherent measurement values, the hardware outlay remaining the same.

It thus becomes possible to operate incremental delta-sigma analog-to-digital converters having a very high order in a range that is stable in terms of signal engineering, without having to reduce the input dynamic range by damping the input signals.

The invention claimed is:

1. A method for setting an effective resolution of an output signal in an incremental delta-sigma analog-to-digital conversion by an incremental delta-sigma analog-to-digital converter, comprising: feeding a difference between an input signal and a reference voltage signal formed in a feedback branch to a first integrator, forming a virtual reference voltage in the feedback branch of the incremental delta-sigma analog-to-digital converter, adapting the reference voltage signal to a changing input signal range with a settable reference capacitance, and settling a clock cycle number N dependent thereon.

2. The method according to claim 1, wherein the reference capacitance is adapted and set by a controllable capacitance array.

3. The method according to claim 1, wherein selection of the reference capacitance and the setting of the clock cycle number N are carried out in such a way that the input signal in a range of an operating voltage of $+/-V_{DD}$, modulates the incremental delta-sigma analog-to-digital converter to a maximum possible extent in a manner free of overdriving.

4. The method according to claim 2, wherein the reference capacitance and the clock cycle number N are set by a control unit.

5. The method according to claim 4, wherein the control unit controls at least two integrator stages of the incremental delta-sigma analog-to-digital converter, a quantizer and a digital-to-analog converter in the feedback branch.

6. The method according to claim 4, wherein the control unit determines and sets an optimum clock cycle number according to a required accuracy range of the incremental delta-sigma analog-to-digital converter, the set reference capacitance or further to incremental delta-sigma analog-to-digital converter inherent measurement values dependent algorithm.

7. The method according to claim 1, wherein a single incremental delta-sigma analog-to-digital converter is used for multiplexed systems.

8. The method according to claim 1, wherein the incremental delta-sigma analog-to-digital converter is adapted to an accuracy requirement with regard to effective resolution of an output signal.

9. An arrangement for incremental delta-sigma analog-to-digital conversion, wherein the incremental delta-sigma analog-to-digital converter comprises a difference forming unit for forming a difference between an analog modulator input signal and an analog reference voltage signal and for generating a difference voltage signal, a resettable first integrator for integrating or summing the difference signal and generating a first integrator signal, a quantizer for receiving the integrator signal and generating a digital quantization signal, and a digital-to-analog converter in a feedback branch for receiving the digital quantization signal and outputting the reference voltage signal to the difference forming unit, wherein a controllable capacitance array is arranged in the feedback branch, and wherein the capacitance array, at least one integrator, the quantizer and the digital-to-analog converter in the feedback branch are connected to a control unit in a controlling fashion.

10. The arrangement for incremental delta-sigma analog-to-digital conversion according to claim 9, wherein the incremental delta-sigma analog-to-digital converter has a number of integrator stages.

11. The arrangement for incremental delta-sigma analog-to-digital conversion according to claim 9, wherein an input signal in a range of an operating voltage of $+/-V_{DD}$ of the incremental delta-sigma analog-to-digital converter is fully modulatable independently of the number of integrator stages.

12. The arrangement for incremental delta-sigma analog-to-digital conversion according to claim 9, wherein the control unit comprises a clock control logic.

* * * * *